(12) United States Patent
Kim

(10) Patent No.: US 7,309,896 B2
(45) Date of Patent: Dec. 18, 2007

(54) ELECTROSTATIC DISCHARGE PROTECTION DEVICE

(75) Inventor: Kil-Ho Kim, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 100 days.

(21) Appl. No.: 11/270,960

(22) Filed: Nov. 9, 2005

(65) Prior Publication Data

US 2006/0097321 A1    May 11, 2006

(30) Foreign Application Priority Data

Nov. 10, 2004  (KR) .................. 10-2004-0091419

(51) Int. Cl.
*H01L 27/04* (2006.01)

(52) U.S. Cl. .................. 257/355; 257/107; 257/328; 257/335; 257/E29.181

(58) Field of Classification Search ............... 257/355, 257/107, 328, 335
See application file for complete search history.

(56) References Cited

U.S. PATENT DOCUMENTS 6,850,397 B2 * 2/2005 Russ et al. ............... 361/91.8

2006/0097321 A1 * 5/2006 Kim ............... 257/355

FOREIGN PATENT DOCUMENTS

| KR | 2002-0013701 | 2/2002 |
|---|---|---|
| KR | 10-2004-0082832 | 9/2004 |

* cited by examiner

*Primary Examiner*—Andy Huynh
*Assistant Examiner*—Tony Tran
(74) *Attorney, Agent, or Firm*—Blakely, Sokoloff, Taylor & Zafman

(57) ABSTRACT

An electrostatic discharge (ESD) protection device is provided. The apparatus includes: a double diffused drain N-type metal oxide semiconductor field effect transistor (MOSFET); a P-type silicon controlled rectifier (SCR); a double diffused drain P-type MOSFET; and an N-type SCR, wherein: the double diffused drain N-type MOSFET is connected in parallel with the P-type SCR between an output pad and a first voltage pad; the double diffused drain P-type MOSFET is connected in parallel with the N-type SCR between the output pad and a second voltage pad; and the N-type SCR is connected in parallel with the P-type SCR between the first voltage pad and the second voltage pad.

5 Claims, 21 Drawing Sheets

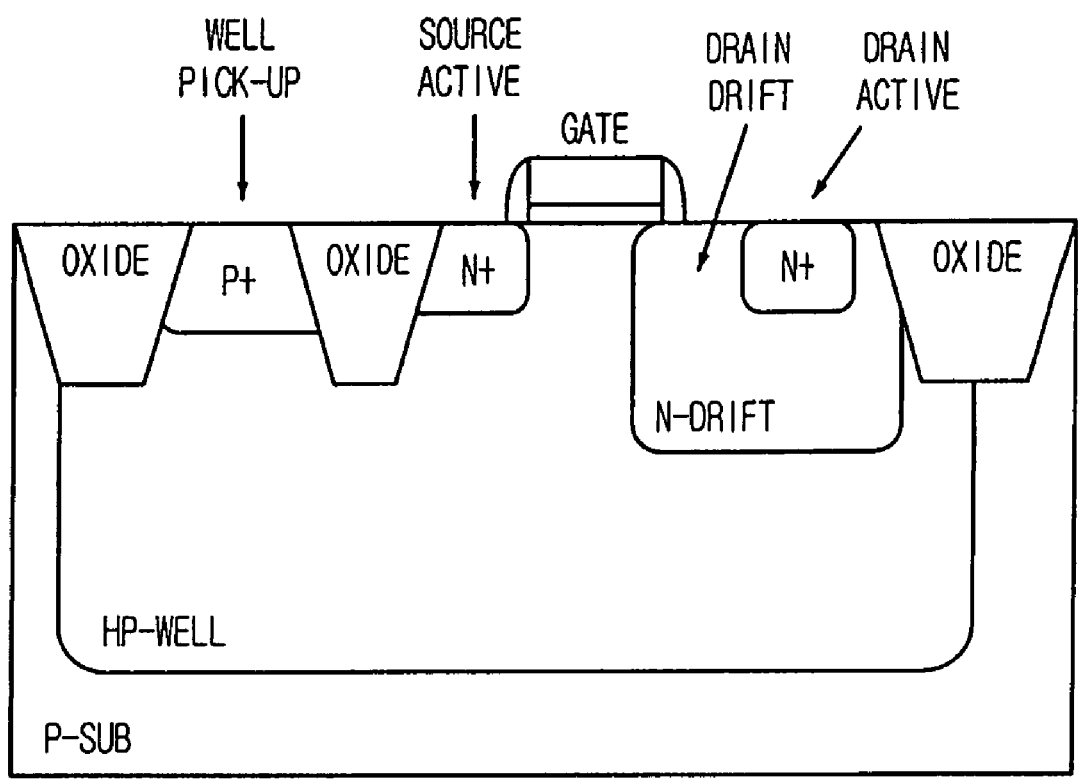

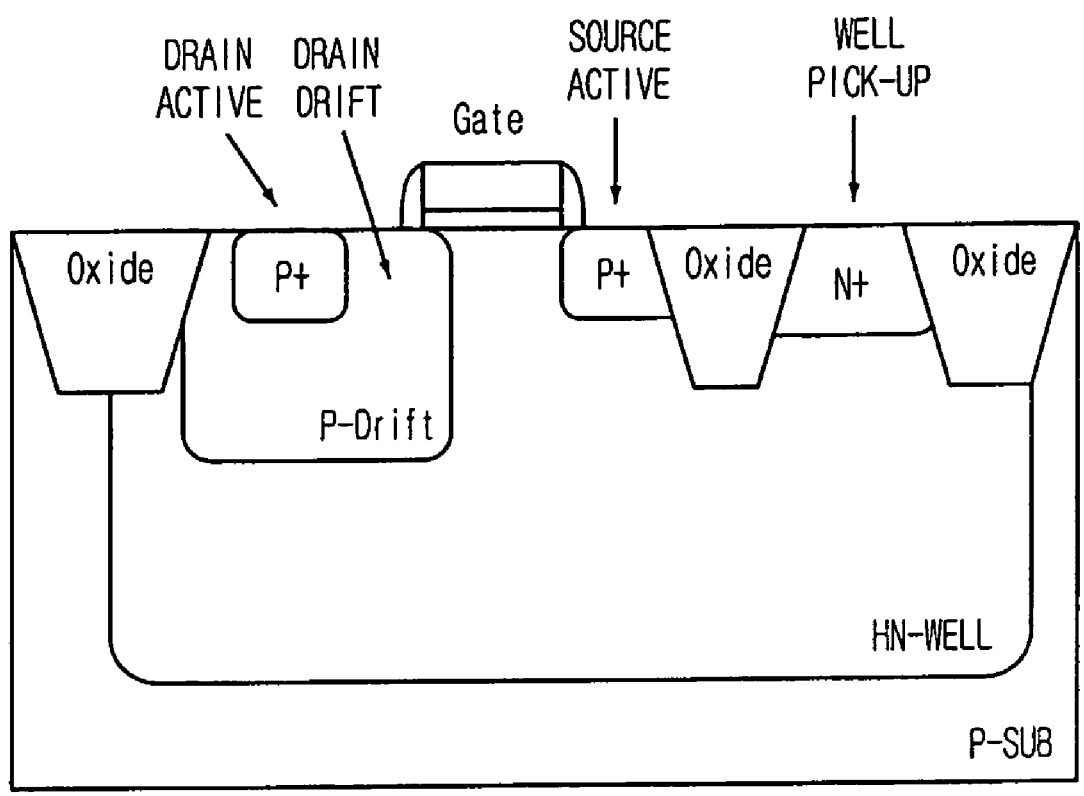

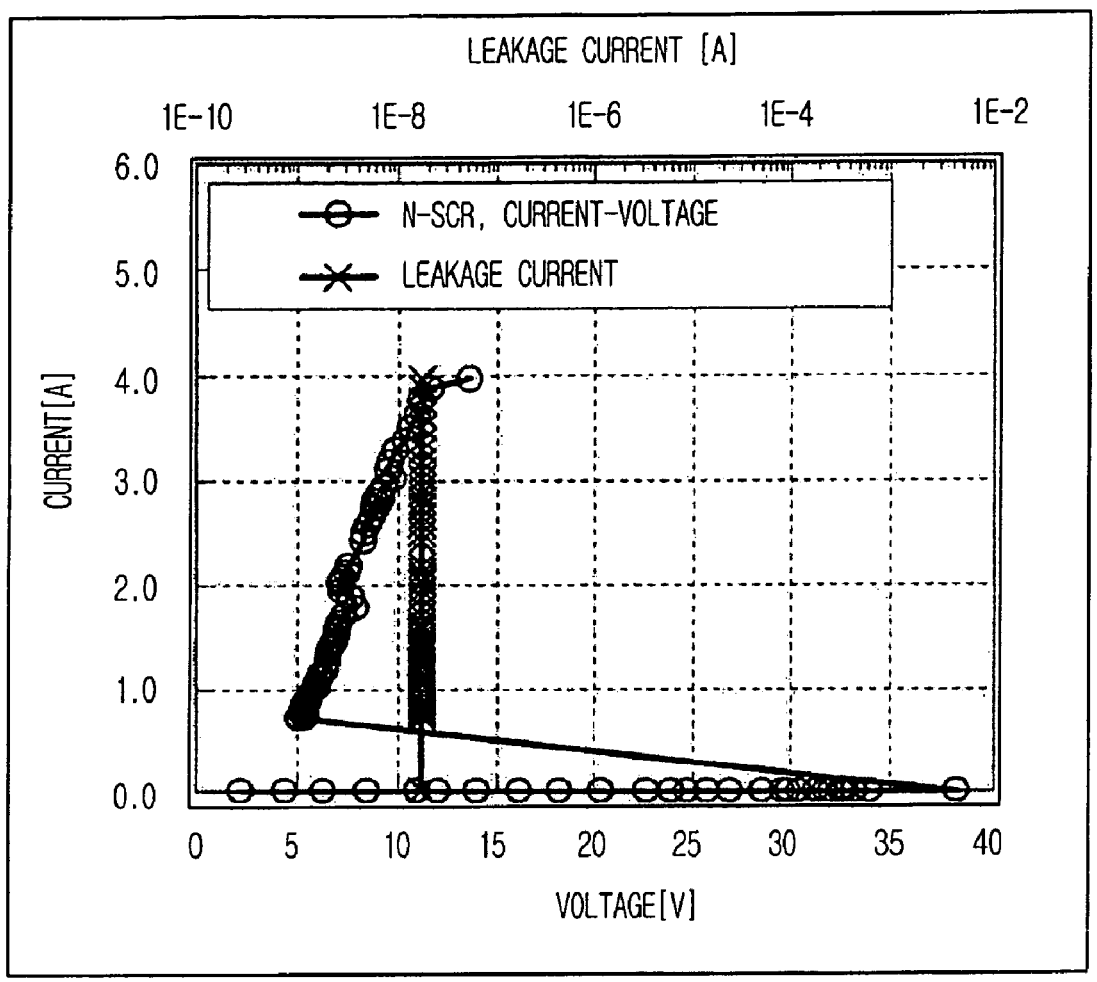

ELECTROSTATIC DISCHARGE PROTECTION DEVICE

FIELD OF THE INVENTION

The present invention relates to an electrostatic discharge (ESD) protection device; and, more particularly, to an ESD protection device which occupies a minimal region and is capable of protecting a microchip operating in high voltage from an ESD stress current.

DESCRIPTION OF RELATED ARTS

Configuring an electrostatic discharge (ESD) protection circuit using an ESD protection device in an output circuit can be largely divided into two methods; they are, a self protection method and an external protection method.

FIG. 1A shows the self protection method utilizing a parasitic horizontal NPN (or PNP) bipolar junction transistor (BJT) and a parasitic $N^+$ (or $P^+$) diode embedded in an NMOS (PMOS) output driver for a protection from ESD.

Such self protection method can be applied only when a countering ability of the parasitic horizontal NPN (or PNP) BJT toward a stress current is sufficient.

Also, an additional ESD protection is generally required between a Vdd pad and a Vss pad, separate from the ESD protection for each output pad using the parasitic transistor and the parasitic diode.

Referring to FIG. 1B, the external protection method with an additional ESD protection device separate from an NMOS (or PMOS) output driver is illustrated, wherein the additional ESD protection device is applied when the countering ability of a parasitic horizontal NPN (or PNP) BJT toward a stress current is insufficient. Also, in this case, an additional ESD protection is generally required between a Vdd pad and a Vss pad separate from the ESD protection for each output pad.

The external ESD protection method can provide a more favorable ESD protection without being limited by an ESD protection characteristic of the parasitic horizontal NPN (or PNP) BJT. However, the external ESD protection method has a limitation of generally requiring a large portion of a layout region for the additional ESD protection device.

Referring to FIGS. 2A and 2B, double diffused drain metal oxide semiconductor field effect transistors (MOSFET) operating in high voltage are illustrated.

A semiconductor device operating in high voltage is generally required to have an avalanche breakdown voltage higher than an operation voltage. To fulfill such requirement, an N-type MOSFET employing a drain with a double diffused dopant, that is the double diffused drain N-type MOSFET (DDDNMOS), is used as a basic device as shown in FIG. 2A.

To build the DDDNMOS structure, the dopant is double-implanted to the drain. Herein, a sufficiently high concentration of the dopant is implanted in an internal drain active region, i.e. an $N^+$ or $P^+$ active region, at a dose ranging from approximately $10^{15}$ cm$^{-3}$ to approximately $10^{16}$ cm$^{-3}$, and a relatively low concentration of the dopant is implanted in an external drain drift region, i.e. an N-drift or P-drift region, at a dose ranging from approximately $10^{13}$ cm$^{-3}$ to approximately $10^{14}$ cm$^{-3}$. In most cases, the dopant implantation is simultaneously performed to a source active region and the drain active region, resulting in an identical dopant concentration in both of the regions. A well, which forms a channel, is implanted with a P-type or N-type dopant in a lower concentration when compared to the drain drift region. Herein, a generally used dose is approximately $10^{12}$ cm$^{-3}$.

A junction breakdown voltage is determined by a dopant concentration between two regions conjugating with electrically opposite polarities. Thus, the junction breakdown voltage of the DDDNMOS is determined by the dose implanted in the N-drift region and an HP-well region, and the junction breakdown voltage of a DDDPMOS is determined by the dose implanted in the P-drift region and an HN-well region.

Generally, the junction breakdown voltage tends to ascend as the dopant concentration of two regions conjugating with electrically opposite polarities decreases. However, by employing the double diffused drain structure, the dopant concentration of the drain drift region in contact with the well region can be sufficiently lowered, and thus the desired level of high junction breakdown voltage can be obtained.

FIGS. 3A and 3B show typical voltage-current characteristics of a DDDNMOS operating in high voltage working as an ESD protection device, i.e. working as a parasitic horizontal NPN BJT. From the viewpoint of the ESD protection device, it is difficult to utilize the DDDNMOS as the ESD protection device due to the following limitations.

The DDDNMOS is not sufficiently strong toward the stress current when operating as the parasitic horizontal NPN BJT. That is, the DDDNMOS cannot handle more than a predetermined level of the stress current.

Also, a thermal breakdown voltage of the DDDNMOS is smaller than a BJT trigger voltage when operating as the parasitic horizontal NPN BJT. As a result, each of the fingers in a multi-finger structure does not operate uniformly, and thus increasing the number of fingers (or the total active width) cannot strengthen the countering ability of the DDDNMOS toward the ESD stress current.

In conclusion, in a high voltage operation output circuit, the ESD protection characteristic is weak when the output driver (i.e., DDDNMOS) operates as the parasitic horizontal NPN BJT, and thus, it is hard to employ the self protection method illustrated in FIG. 1A in the high voltage operation output circuit.

Thus, as shown in FIG. 1B, the high voltage operation output circuit generally employs the external protection method.

An example of employing the external protection method in the high voltage operation output circuit is shown in FIGS. 4A and 4B.

As shown in FIG. 4A, in an N-type silicon controlled rectifier (SCR) with a PMOS pass structure, the N-type SCR formed between an output pad and a Vss pad operates to counter an ESD stress current with polarities resulted when a ground voltage Vss is ground and an output voltage is positive. Herein, the N-type SCR includes a horizontal NPN BJT and a vertical PNP BJT, mutually coupled. At this time, an avalanche breakdown voltage of the horizontal NPN BJT is determined by a horizontal breakdown voltage of an N-drift/HP-well junction, and an avalanche breakdown voltage of the vertical PNP BJT is determined by a vertical breakdown voltage of the N-drift/HP-well junction. Generally, the horizontal breakdown voltage is lower than the vertical breakdown voltage.

Therefore, a trigger voltage of the N-type SCR operating when the ground voltage Vss is ground and the output voltage is positive, is determined by the avalanche breakdown voltage of the horizontal NPN BJT.

On the other hand, an $N^+$ active (N-drift)/HP-well diode operates to counter the ESD stress current with a polarity resulted when the ground voltage Vss is positive and the output voltage is ground. Herein, the N+ active (N-drift)/HP-well diode is forward biased between the Vss pad and the output pad.

As shown in FIG. 4B, in a P-type SCR with an NMOS pass structure, the P-type SCR formed between a Vdd pad and an output pad operates to counter an ESD stress current with polarities resulted when a power supply voltage Vdd is positive and an output voltage is ground. Herein, the P-type SCR includes a horizontal PNP BJT and a vertical NPN BJT, mutually coupled. At this time, an avalanche breakdown voltage of the horizontal PNP BJT is determined by a horizontal breakdown voltage of a P-drift/HN-well junction, and an avalanche breakdown voltage of the vertical NPN BJT is determined by a vertical breakdown voltage of the P-drift/HN-well junction. Generally, the horizontal breakdown voltage is lower than the vertical breakdown voltage. Therefore, a trigger voltage of the P-type SCR operating when the power supply voltage Vdd is positive and the output voltage is ground, is determined by the avalanche breakdown voltage of the horizontal PNP BJT.

On the other hand, a P+ active (P-drift)/HN-well diode operates to counter the ESD stress current with polarities resulted when the power supply voltage Vdd is ground and the output voltage is positive. Herein, the P+ active (P-drift)/HN-well diode is forward biased between the Vdd pad and the output pad.

FIGS. 5A and 5B illustrate typical current-voltage characteristics of the N-type SCR with the PMOS pass structure (or the P-type SCR with the NMOS pass structure) operating in high voltage, while operating as the ESD protection device.

Generally, the N-type SCR with the PMOS pass structure (or the P-type SCR with the NMOS pass structure) shows better ESD protection characteristics than the DDDMOS. That is, the N-type SCR with the PMOS pass structure (or the P-type SCR with the NMOS pass structure) can handle a sufficient amount of the stress current. Also, each of the fingers operates uniformly in a multi finger structure, and thus, the countering ability for the ESD stress current is increased proportionate to the number of fingers (or the total active width). In conclusion, the sufficient ESD protection in the high voltage operation output circuit can be achieved by employing the external protection method shown in FIG. 1B, using the N-type SCR with the PMOS pass structure (or the P-type SCR with the NMOS pass structure). However, such external protection method generally requires an additional ESD protection device separate from the output driver, and thus, there arises a limitation of utilizing a large portion of the layout.

SUMMARY OF THE INVENTION

It is, therefore, an object of the present invention to provide an electrostatic discharge protection device capable of functioning similarly to an N-type silicon controlled rectifier (SCR) with a p-channel metal oxide semiconductor (PMOS) pass structure or a P-type SCR with an NMOS pass structure while occupying a minimal region on a layout region.

In accordance with an aspect of the present invention, there is provided an electrostatic discharge protection device, including: a double diffused drain N-type metal oxide semiconductor field effect transistor (MOSFET); a P-type silicon controlled rectifier (SCR); a double diffused drain P-type MOSFET; and an N-type SCR, wherein: the double diffused drain N-type MOSFET is connected in parallel with the P-type SCR between an output pad and a first voltage pad; the double diffused drain P-type MOSFET is connected in parallel with the N-type SCR between the output pad and a second voltage pad; and the N-type SCR is connected in parallel with the P-type SCR between the first voltage pad and the second voltage pad.

BRIEF DESCRIPTION OF THE DRAWINGS

The above and other objects and features of the present invention will become better understood with respect to the following description of the specific embodiments given in conjunction with the accompanying drawings, in which:

FIGS. 2A and 2B are cross-sectional views illustrating a conventional double diffused drain metal oxide semiconductor field effect transistor (DDDMOSFET) operating in high voltage;

FIGS. 5A and 5B are graphs illustrating current-voltage characteristics of the conventional SCR with the pass structure illustrated in FIG. 4;

DETAILED DESCRIPTION OF THE INVENTION

An electrostatic discharge (ESD) protection device in accordance with specific embodiments of the present invention will be described in detail with reference to the accompanying drawings.

Figure 1A:
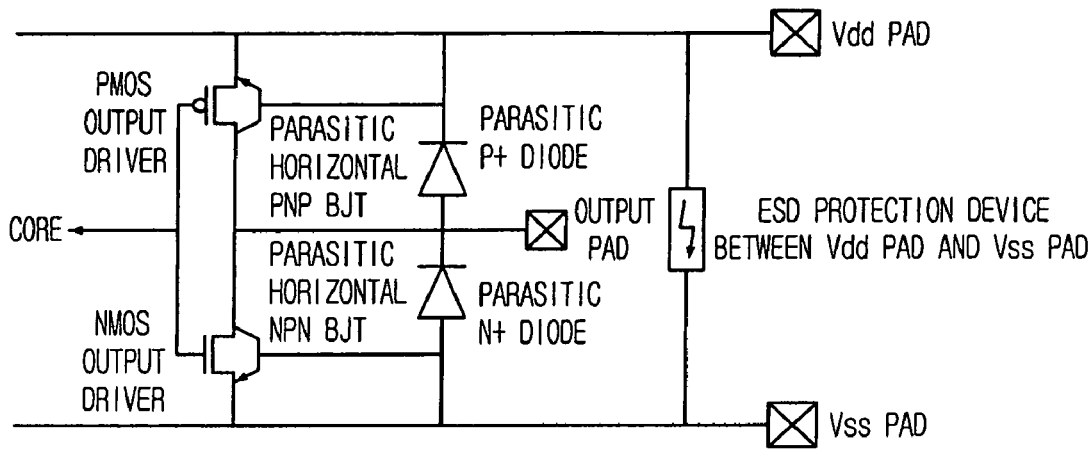
FIGS. 1A and 1B are schematic diagrams illustrating an electrostatic discharge (ESD) protection system of a conventional output circuit.
Figure 1B:
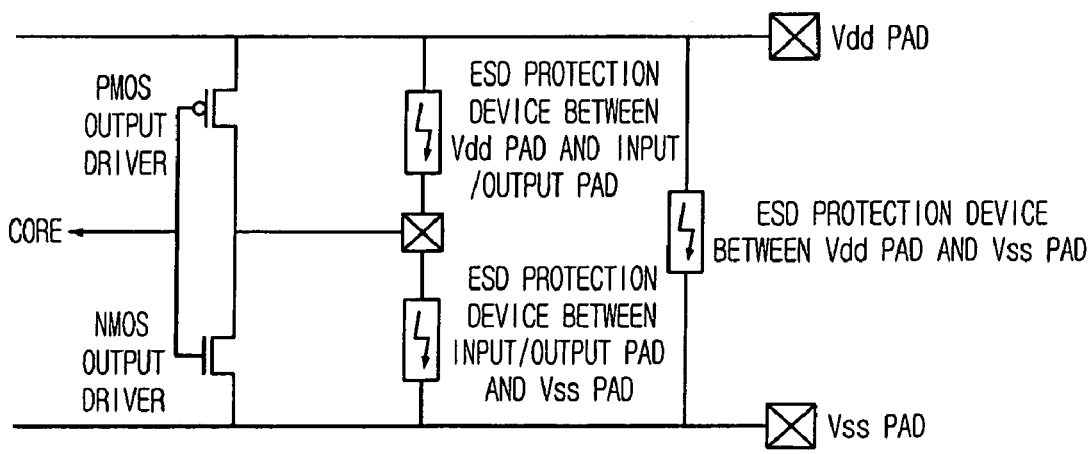
Figure 3A:
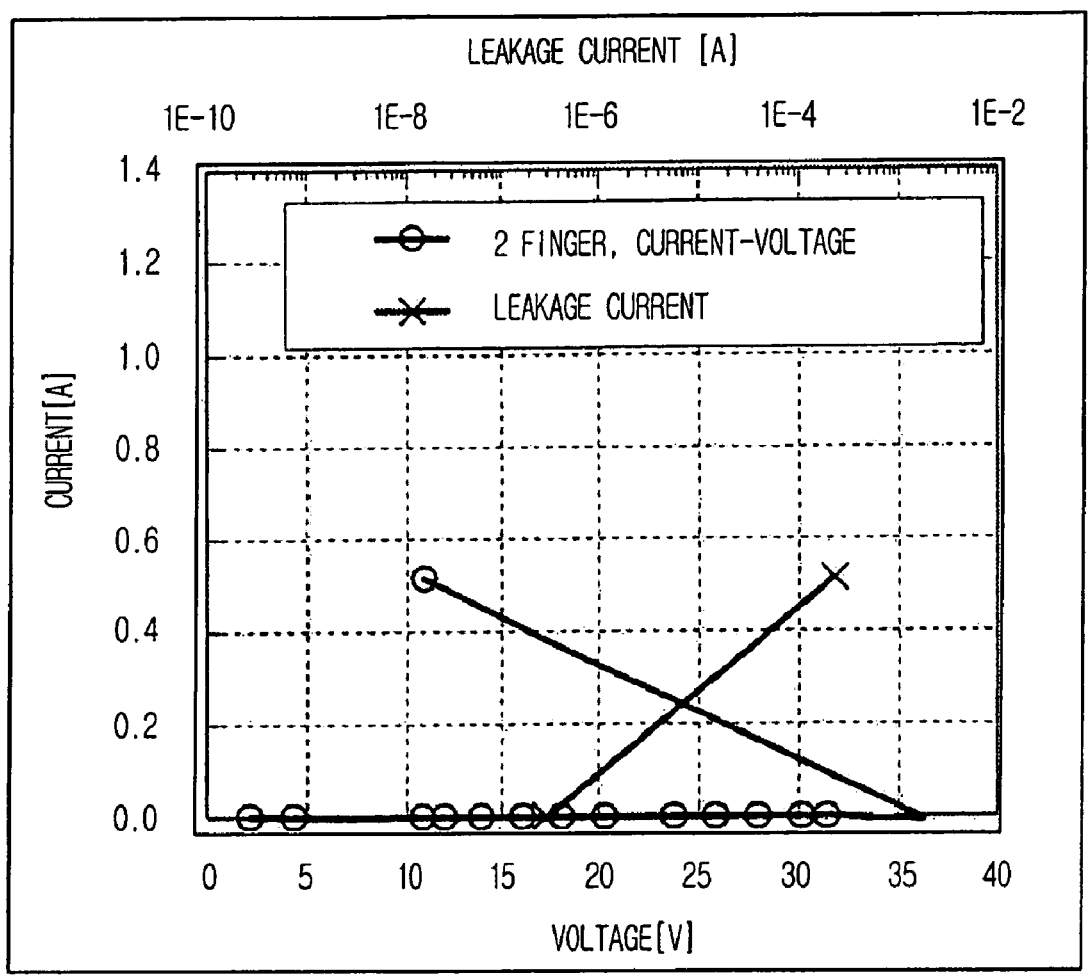
FIGS. 3A and 3B are graphs illustrating current-voltage characteristics of a conventional double diffused drain N-type MOSFET (DDDMOS)
Figure 3B:
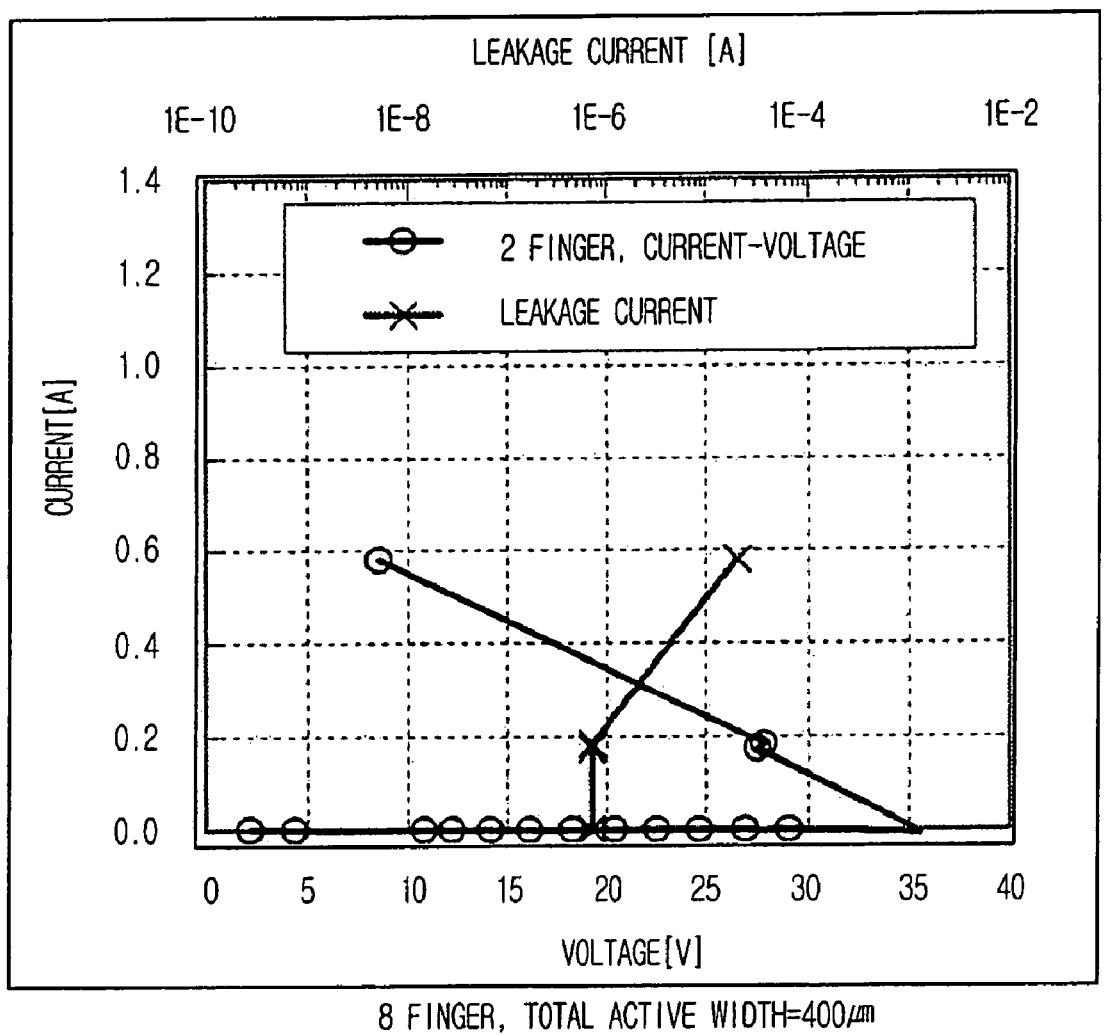
Figure 4A:
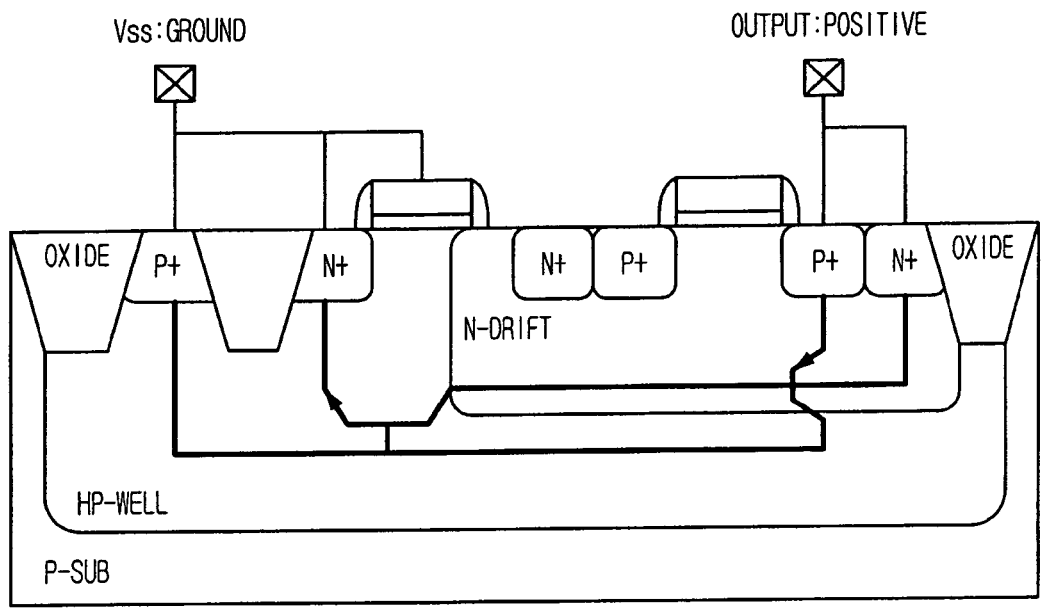
FIGS. 4A and 4B are cross-sectional views illustrating a conventional silicon controlled rectifier (SCR) with a pass structure.
Figure 4B:
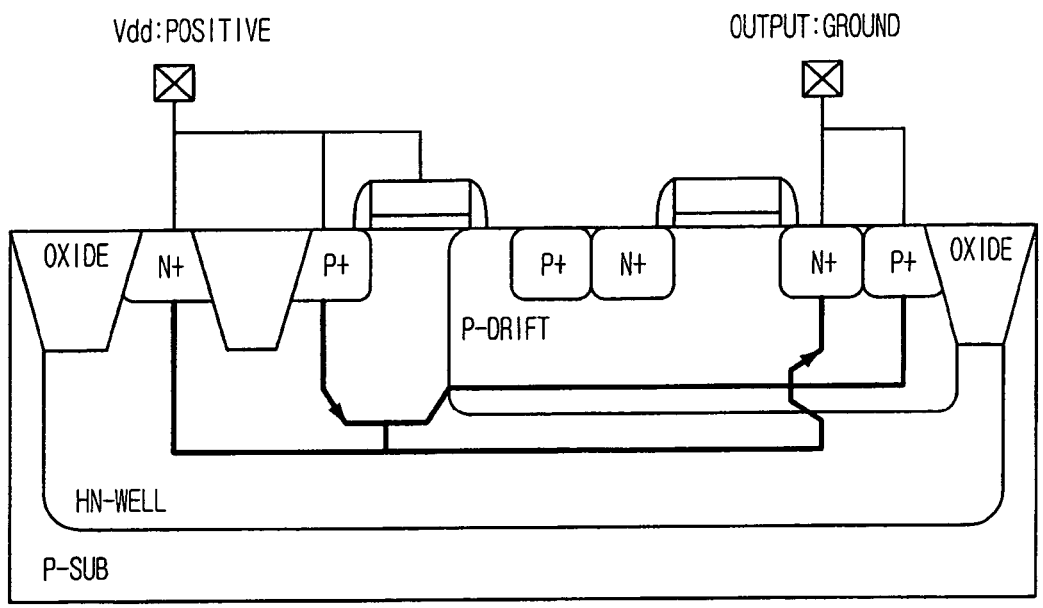
Figure 5B:
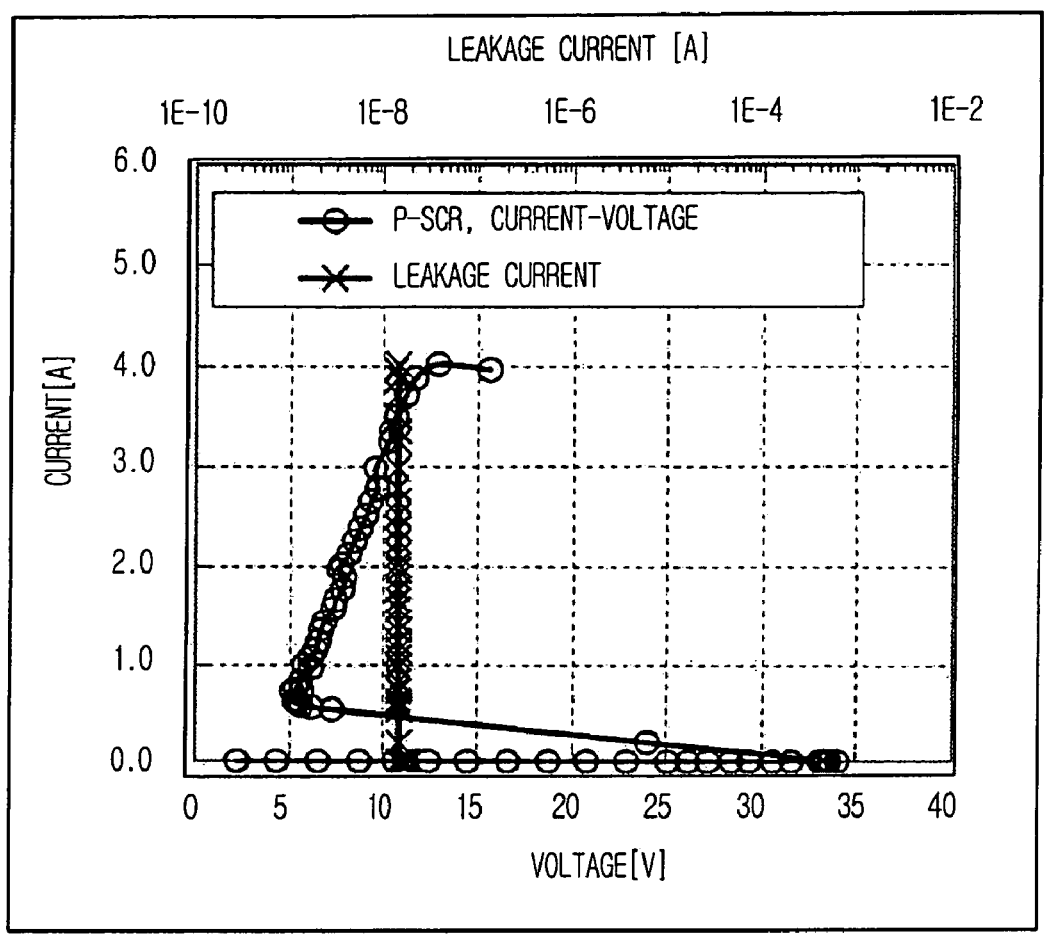
Figure 6:
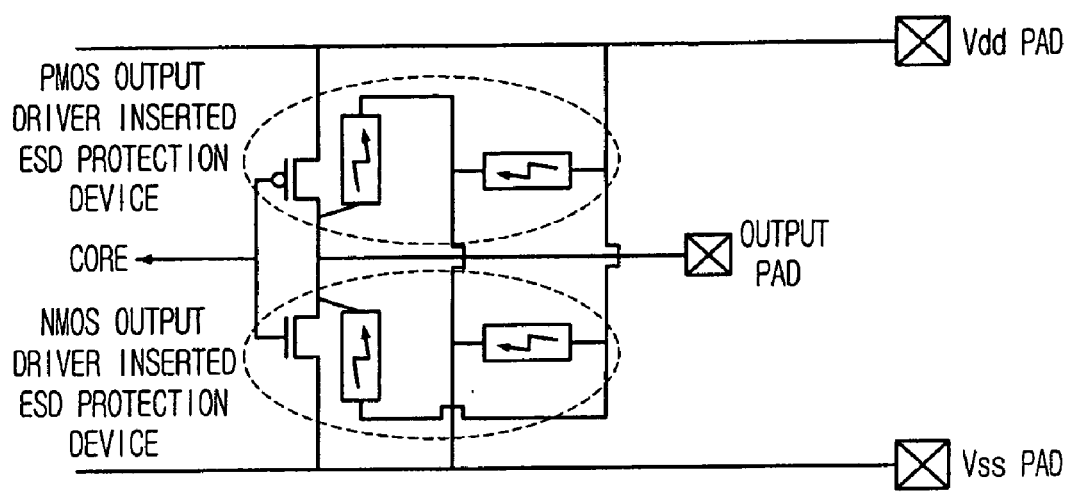
FIG. 6 is a diagram briefly illustrating an ESD protection device in accordance with a specific embodiment of the present invention.

As shown in FIG. 6, in an ESD protection method in accordance with a specific embodiment of the present invention, an output driver, a metal oxide semiconductor field effect transistor (MOSFET), is integrated with an ESD protection device with characteristics identical to a silicon controlled rectifier (SCR) to provide a sufficient ESD protection with a minimized layout region.

The ESD protection method and the ESD protection devices suggested in this invention are illustrated in FIGS. 6 to 9B.

Figure 7A:
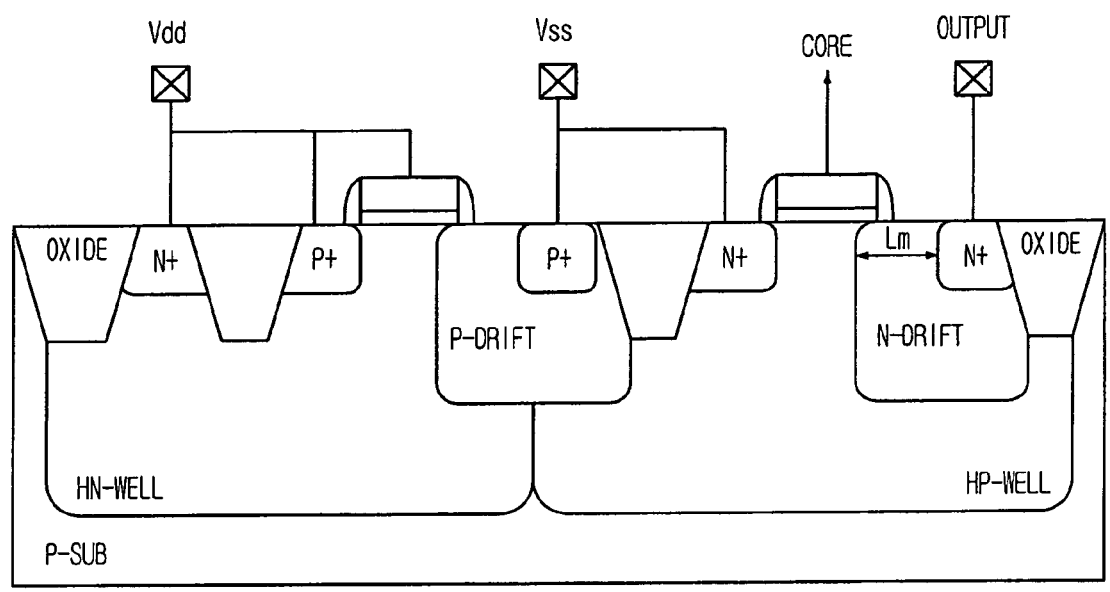
FIGS. 7A, 7B, 8A, 8B, 9A and 9B are cross-sectional views illustrating a structure of the ESD protection device in accordance with the specific embodiment of the present invention.

An NMOS output driver-inserted P-type SCR structure in accordance with the specific embodiment of the present invention performs a current operation function by an NMOS operation between an output pad and a Vss pad and an ESD protection function by a P-type SCR between the output pad and a Vdd pad. That is, in the NMOS output driver-inserted P-type SCR structure, a double diffused drain N-type MOSFET (DDDNMOS) is formed between the output pad and the Vss pad, and a structure similar to an SCR with an NPNP structure, wherein a horizontal PNP BJT and a vertical NPN BJT are mutually coupled, is formed between the output pad and the Vdd pad. As illustrated in FIGS. 6 and 7A, the DDDNMOS is inserted inside the SCR structure. Herein, a P$^+$ active region and a P-drift region composing the double diffused drain are formed to simultaneously contact an HN-well and an HP-well, such that a trigger voltage of the P-type SCR is identical to that of the output driver.

Figure 7B:
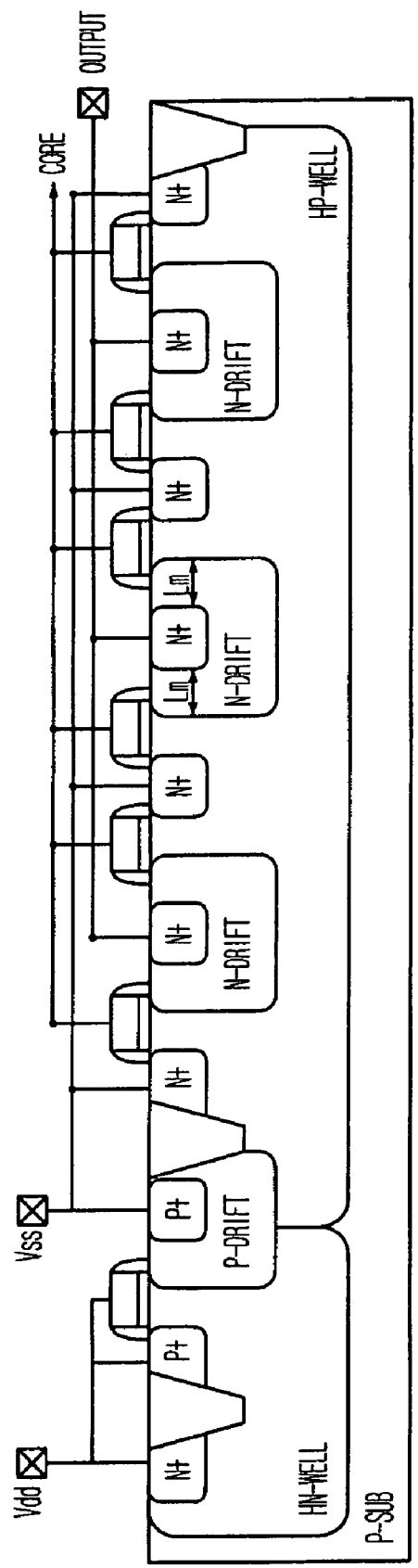

Meanwhile, FIG. 7B is a cross-sectional view illustrating another NMOS output driver-inserted P-type SCR structure. Especially, a DDDNMOS with a multi finger structure is inserted inside the P-type SCR structure.

Figure 8A:
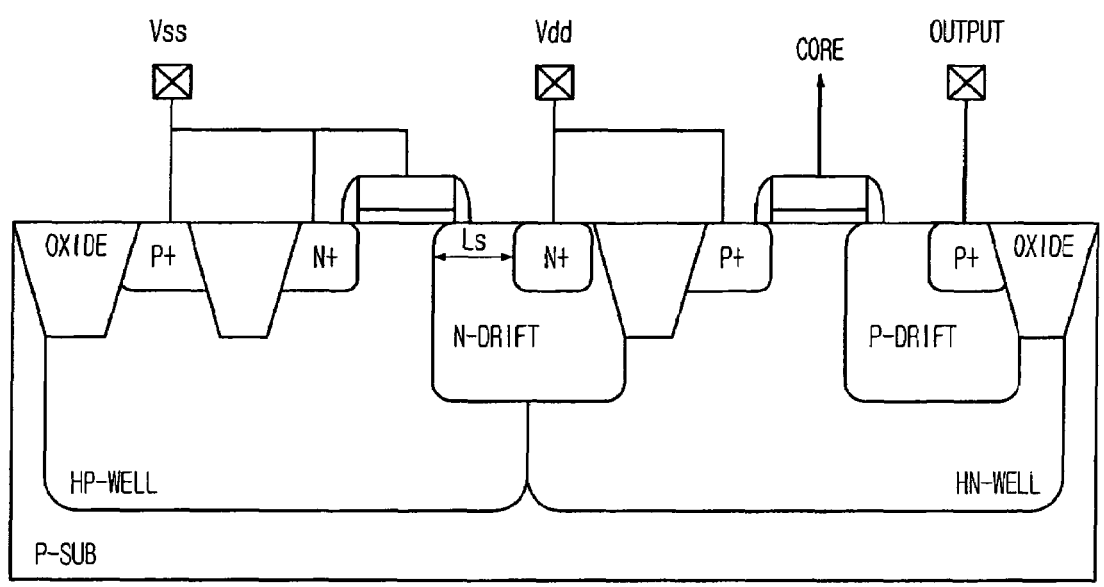
Figure 8B:
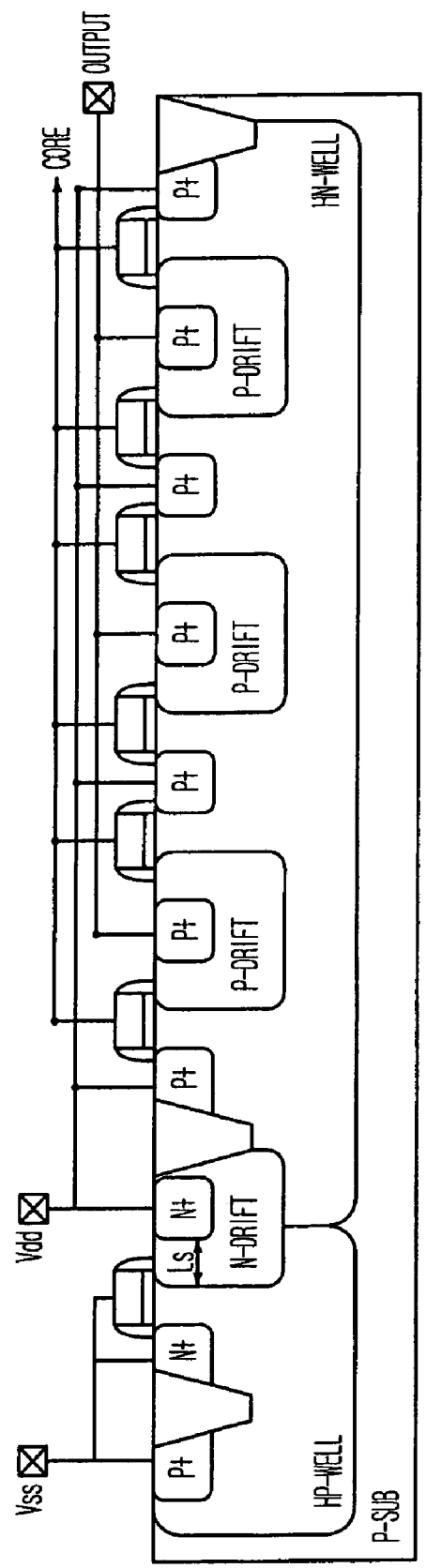

Also, a PMOS output driver-inserted N-type SCR structure performs the current operation function by a PMOS operation between the output pad and the Vdd pad and the ESD protection function by an N-type SCR between the output pad and the Vss pad. That is, in the PMOS output driver-inserted N-type SCR structure, a double diffused drain P-type MOSFET (DDDPMOS) is formed between the output pad and the Vdd pad, and a structure similar to an SCR with a PNPN structure, wherein a horizontal NPN BJT and a vertical PNP BJT are mutually coupled, is formed between the output pad and the Vss pad. That is, the DDDPMOS is inserted inside the SCR structure. Herein, as shown in FIGS. 6, 8A and 8B, a first overlay margin (Ls) of an N-drift region with respect to an N+ active region of the Vdd pad of the PMOS output driver-inserted N-type SCR structure is formed slightly smaller than a second overlay margin (Lm) of the N-drift region with respect to the N+ active region of the output pad of the NMOS output driver-inserted P-type SCR structure (i.e., Ls<Lm). FIG. 8B is a cross-sectional view illustrating another PMOS output driver-inserted N-type SCR structure. Especially, a DDDMOS with a multi finger structure is inserted inside the SCR structure.

Figure 9A:
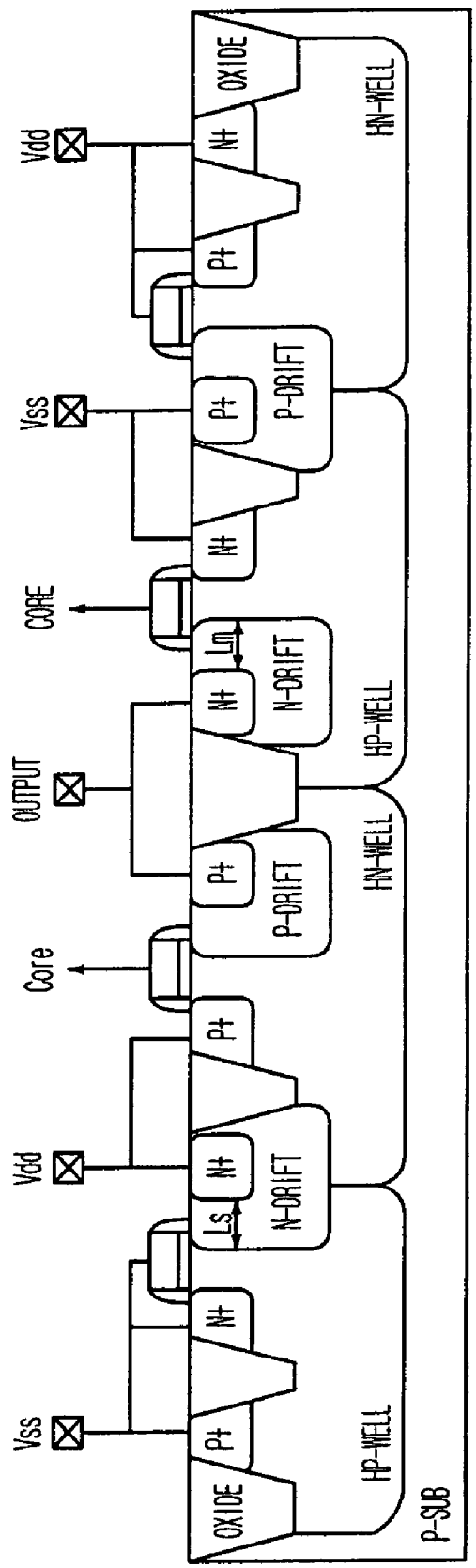
Figure 9B:
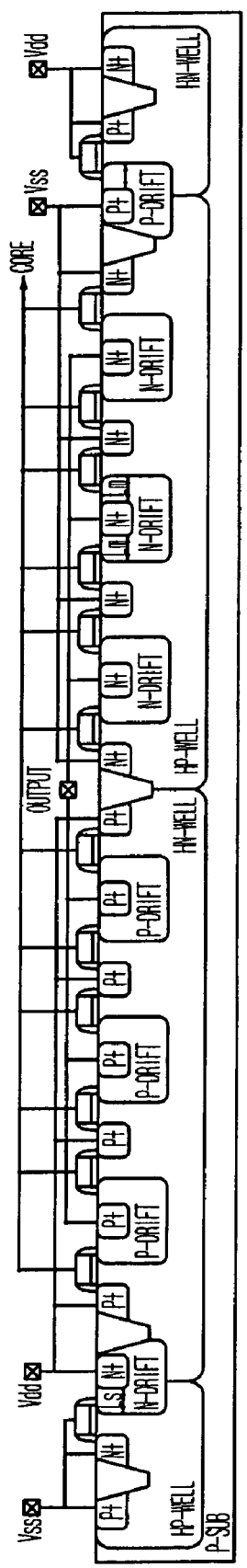

FIGS. 9A and 9B show exemplary ESD protection devices in accordance with the specific embodiment of the present invention. An output circuit is configured by incorporating a PMOS output driver-inserted N-type SCR structure and an NMOS output driver-inserted P-type SCR structure with each other. An output driver (i.e., DDDNMOS) and an N-type SCR including the horizontal NPN BJT and the vertical PNP BJT are connected in parallel between an output pad and a Vss pad, and an output driver (i.e., DDDPMOS) and a P-type SCR including the horizontal PNP BJT and the vertical NPN BJT are connected in parallel between the output pad and a Vdd pad. Also, a structure that the N-type SCR and the P-type SCR are connected in parallel is formed between another Vss pad and another Vdd pad.

Thus, as shown in FIGS. 6 and 7B, it is possible to perform the current operation function for the output pad and the protection functions against all types of the ESD stress current by using the aforementioned circuit.

Hereinafter, referring to FIGS. 10 and 15, the ESD protection operations of the ESD protection device in accordance with the specific embodiment of the present invention will be described.

Figure 10:
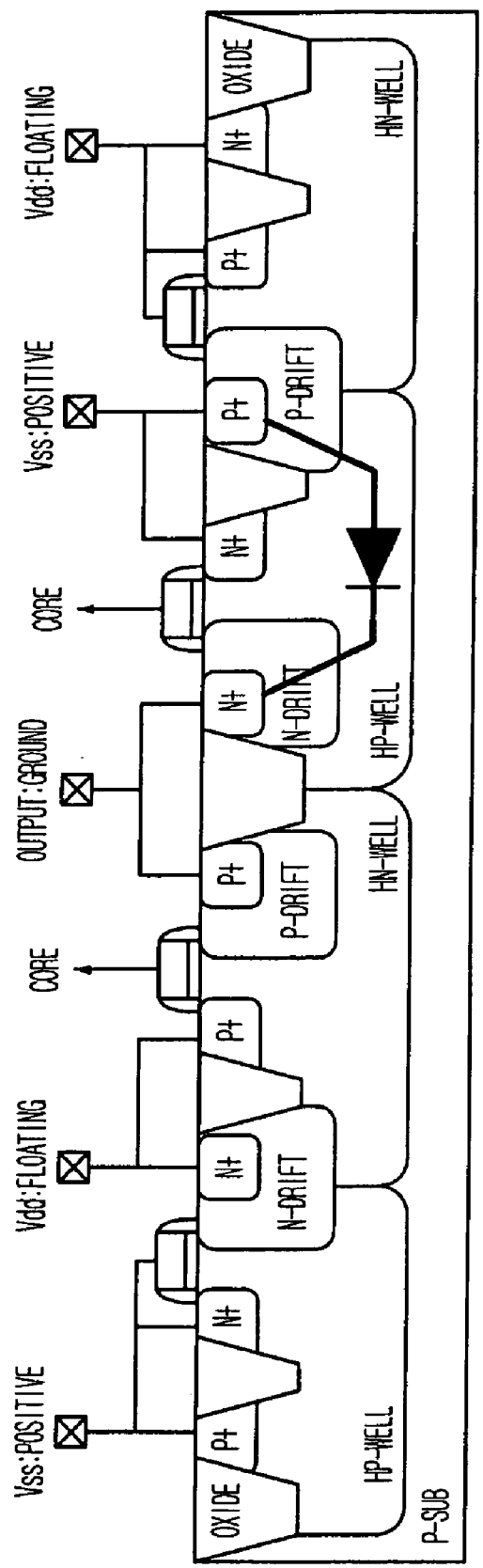
FIGS. 10 to 15 are cross-sectional views illustrating operations of the ESD protection device in accordance with the specific embodiment of the present invention.

Referring to FIG. 10, a forward biased N$^+$ active (N-drift)/HP-well diode formed between the other Vss pad and the output pad operates to counter the ESD stress current with polarities resulted when a ground voltage Vss, a power supply voltage Vdd and an output voltage are positive, floating and ground, respectively. Generally, the Vss pad maintaining a higher voltage than the output pad is assumed as to be in an abnormal operation state, that is, a noise signal or an ESD stress current added state. Meantime, an operation voltage of the forward biased N+ active/HP-well diode is very low ranging from approximately 0.6 V to approximately 1.0 V, and thus, the forward biased N+ active/HP-well diode can efficiently counter the abnormal operation states, wherein the other Vss pad maintains a higher voltage than the output pad.

Figure 11:
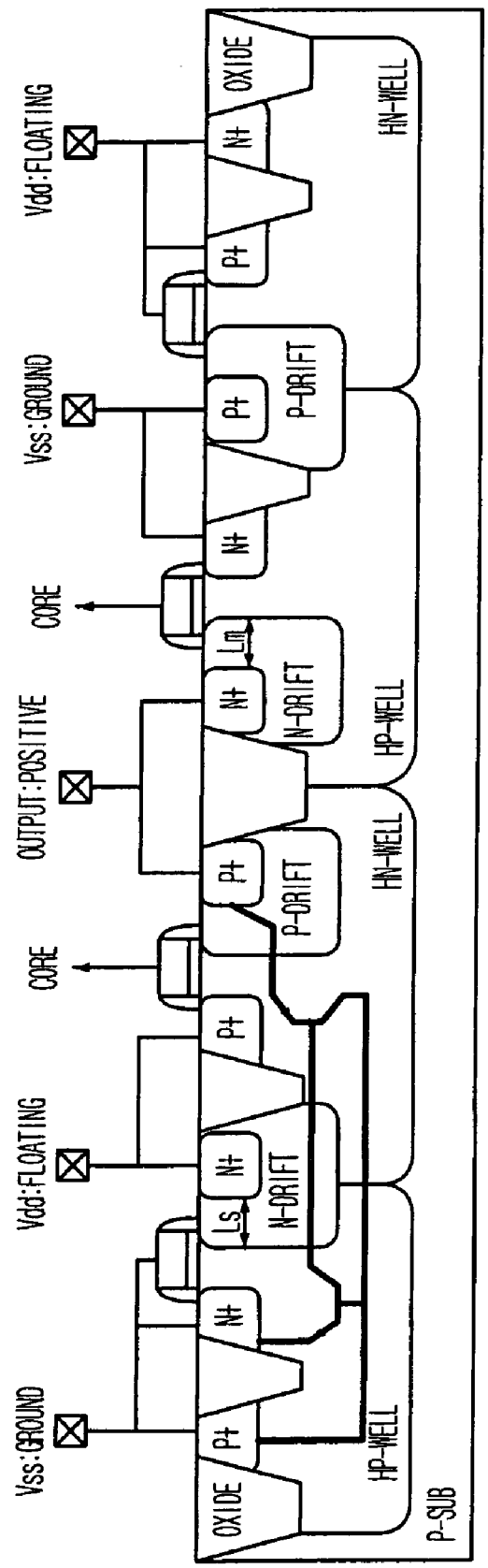

Referring to FIG. 11, the N-type SCR formed between the output pad and the Vss pad operates to counter the ESD stress current with polarities resulted when the ground voltage Vss, the power supply voltage Vdd and the output voltage are ground, floating and positive, respectively. Herein, the N-type SCR includes the horizontal NPN BJT and the vertical PNP BJT, mutually coupled. At this time, an avalanche breakdown voltage of the horizontal NPN BJT is determined by a horizontal breakdown voltage of an N-drift/HP-well junction, and an avalanche breakdown voltage of the vertical PNP BJT is determined by a vertical breakdown voltage of a P-drift/HN-well junction. Generally, the horizontal breakdown voltage is lower than the vertical breakdown voltage.

Therefore, a trigger voltage of the N-type SCR operating when the ground voltage Vss is ground, the power supply voltage Vdd is floating and the output voltage is positive, is determined by the avalanche breakdown voltage of the horizontal NPN BJT.

Meanwhile, the output driver, i.e., DDDNMOS, can also operate as the horizontal NPN BJT when the polarities of the ESD stress current are as following: the ground voltage Vss is ground; the power supply voltage Vdd is floating; and the output voltage is positive. However, as shown in FIG. 11, if the first overlay margin (Ls) of the N-drift region with respect to the N$^+$ active region of the other Vdd pad of the PMOS output driver-inserted N-type SCR structure is formed slightly smaller than the second overlay margin (Lm) of the N-drift region with respect to the N+ active region of the output pad of the NMOS output driver-inserted P-type SCR structure (Ls<Lm), then the N-type SCR operates faster than the output driver, i.e., DDDNMOS, and thus the ESD stress current can be handled by the N-type SCR. Hence, the NMOS output driver, which is the weakest part against the ESD stress current, can be protected.

Figure 12:
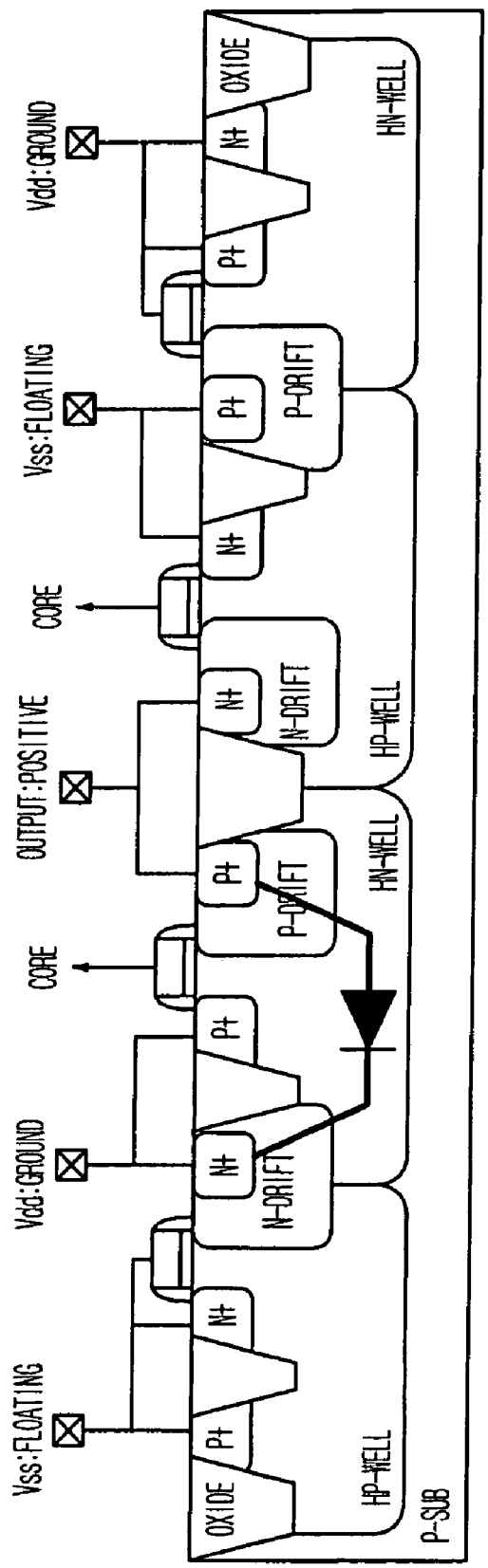

Next, referring to FIG. 12, a forward biased P$^+$ active (P-drift)/HN-well diode formed between the output pad and the other Vdd pad operates to counter the ESD stress current with polarities resulted when a ground voltage Vss, a power supply voltage Vdd and an output voltage are floating, ground and positive, respectively. Generally, the output pad maintaining a higher voltage than the Vdd pad is assumed as to be in an abnormal operation state, that is, a noise signal or an ESD stress current added state. Meantime, the operation voltage of the forward biased P+ active (P-drift)/HN-well diode is very low ranging from approximately 0.6 V to approximately 1.0 V, and thus, the forward biased P+ active (P-drift)/HN-well diode can efficiently counter the abnormal operation states, wherein the output pad maintains a higher voltage than the other Vdd pad.

Figure 13:
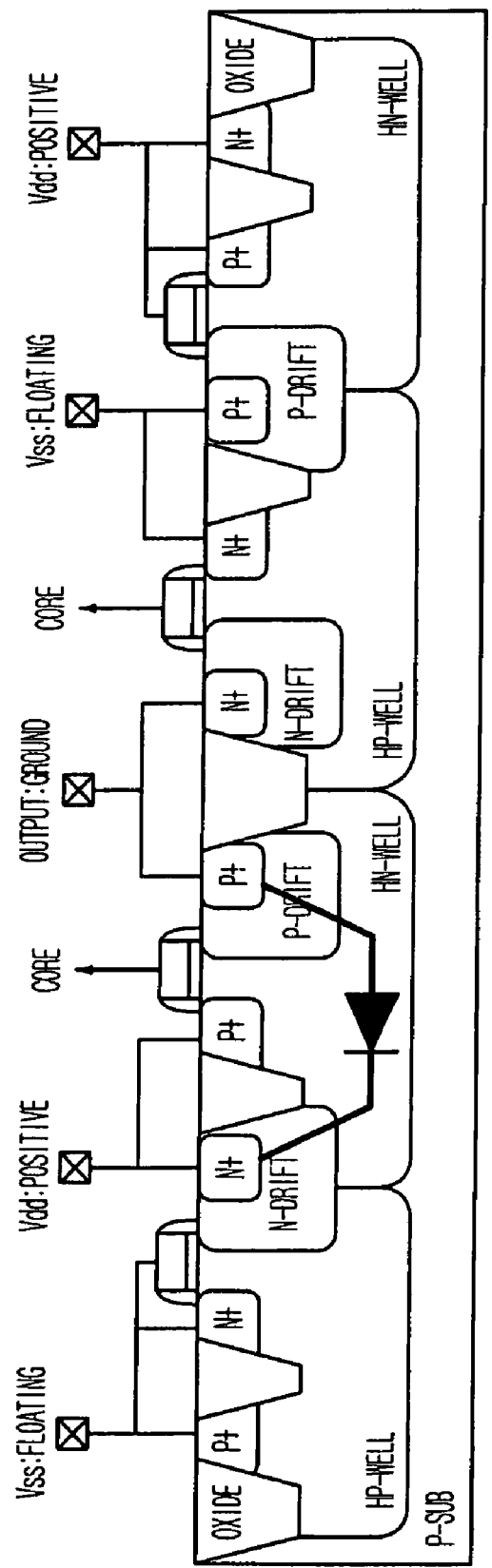

Referring to FIG. 13, the P-type SCR formed between the other Vdd pad and the output pad operates to counter the ESD stress current with polarities resulted when the ground voltage Vss, the power supply voltage Vdd and the output voltage are floating, positive and ground, respectively. Herein, the P-type SCR includes the horizontal PNP BJT and the vertical NPN BJT, mutually coupled. At this time, an avalanche breakdown voltage of the horizontal PNP BJT is determined by a horizontal breakdown voltage of an P-drift/HN-well junction, and an avalanche breakdown voltage of the vertical NPN BJT is determined by a vertical breakdown voltage of the N-drift/HP-well junction. Generally, the horizontal breakdown voltage of the P-drift/HN-well junction is lower than the vertical breakdown voltage of the N-drift/HP-well junction.

Therefore, a trigger voltage of the P-type SCR operating when the ground voltage Vss is floating, the power supply voltage Vdd is positive and the output voltage is ground, is determined by the avalanche breakdown voltage of the horizontal PNP BJT.

The output driver, i.e., DDDPMOS, can also operate as the horizontal PNP BJT when the polarities of the ESD stress current are as following: the ground voltage Vss is floating; the power supply voltage Vdd is positive; and the output voltage is ground. However, because the PNP BJT operation of the DDDPMOS does not generate a snapback event, once the P-type SCR is triggered, most of the ESD stress current is treated through the P-type SCR. Therefore, the PMOS output driver can be effectively protected.

Figure 14:
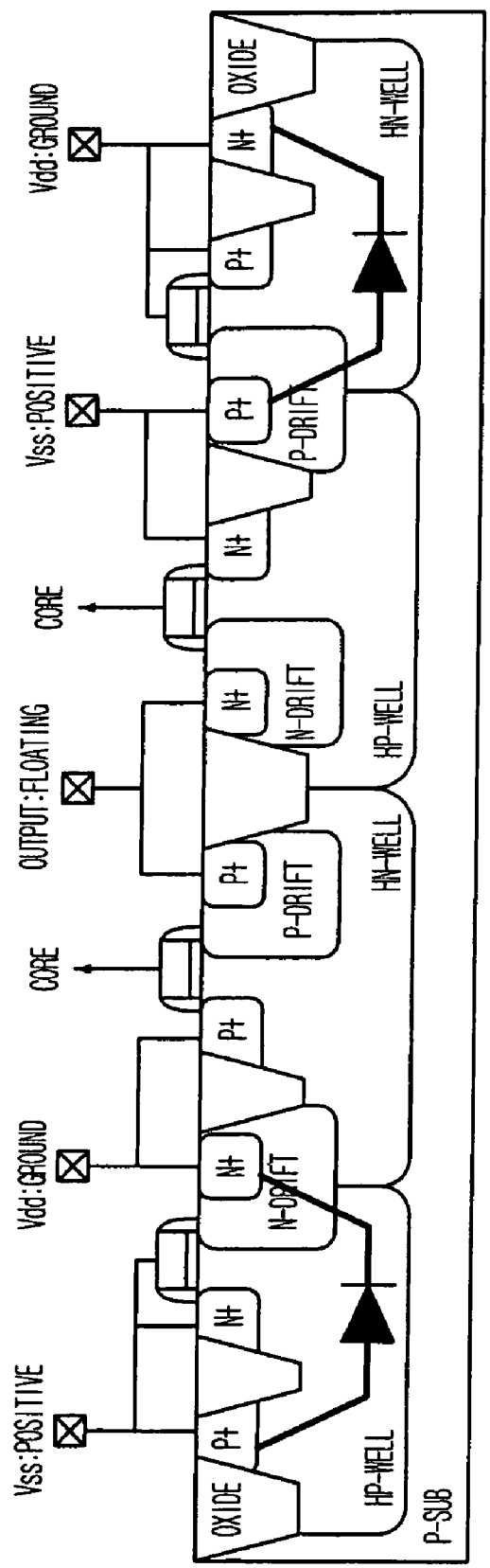

Furthermore, referring to FIG. 14, a forward biased N+ active (N-drift)/HP-well diode formed between the Vss pad and the other Vdd pad operates to counter the ESD stress current with polarities resulted when the ground voltage Vss, the power supply voltage Vdd and the output voltage are positive, ground and floating, respectively. Generally, the Vss pad maintaining a higher voltage than the Vdd pad is assumed as to be in an abnormal operation state, that is, a noise signal or an ESD stress current added state. Meantime, the operation voltage of the forward biased N+ active (N-drift)/HP-well diode is very low, ranging from approximately 0.6 V to approximately 1.0 V, and thus, the forward biased N+ active (N-drift)/HP-well diode can efficiently counter the abnormal operation states, wherein the Vss pad maintains a higher voltage than the other Vdd pad.

Figure 15:
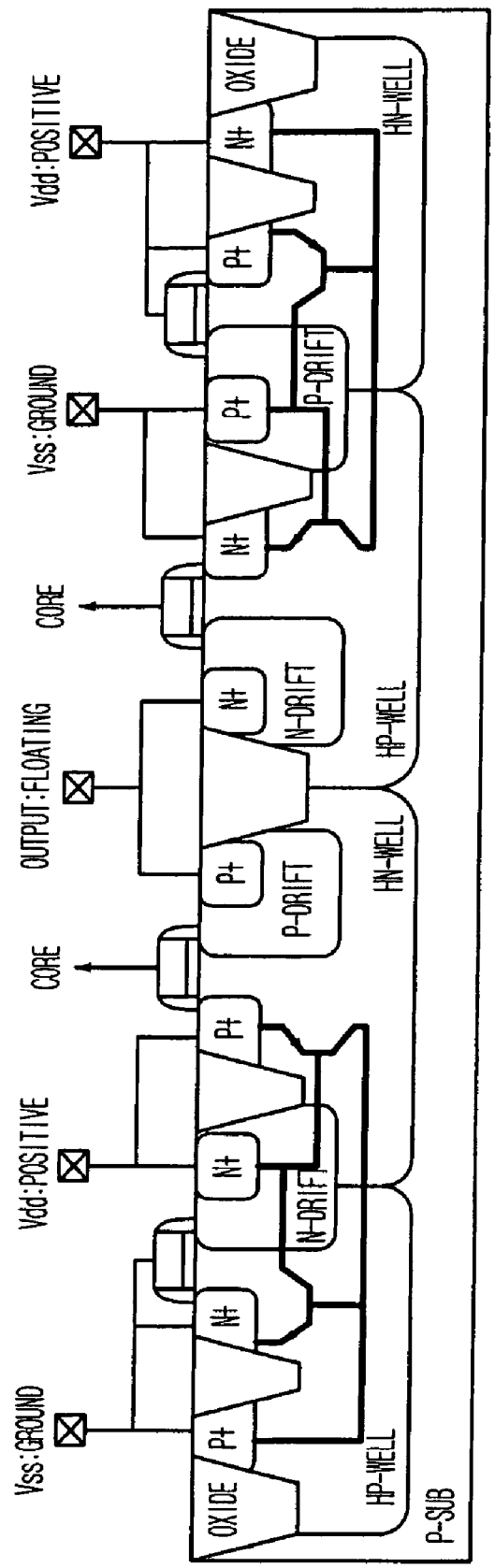

Referring to FIG. 15, the N-type SCR or P-type SCR formed between the other Vdd pad and the other Vss pad operates to counter the ESD stress current when the ESD stress current has polarities as following: a ground voltage Vss is ground; a power supply voltage Vdd is positive; and an output voltage is floating. Herein, the N-type SCR is includes a horizontal NPN BJT and a vertical PNP BJT, mutually coupled. The P-type SCR includes a horizontal PNP BJT and a vertical NPN BJT, mutually coupled.

In accordance with the specific embodiment of the present invention, by integrating a MOSFET, which is an output driver operating an output current, with an ESD protection device, the region covered by an output circuit is decreased, and the sufficient ESD protection is achieved.

In accordance with another specific embodiment of the present invention, a trigger voltage of an ESD protection device is identical to the trigger voltage of each of NMOS and PMOS BJTs of each output buffer in a corresponding ESD stress mode, and thus the output buffer can be efficiently protected.

The present application contains subject matter related to the Korean patent application No. KR 2004-0091419, filed in the Korean Patent Office on Nov. 10, 2004, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An electrostatic discharge protection device, comprising:
   a double diffused drain N-type metal oxide semiconductor field effect transistor (MOSFET);
   a P-type silicon controlled rectifier (SCR);
   a double diffused drain P-type MOSFET; and
   an N-type SCR,
   wherein:
   the double diffused drain N-type MOSFET is connected in parallel with the P-type SCR between an output pad and a first voltage pad;
   the double diffused drain P-type MOSFET is connected in parallel with the N-type SCR between the output pad and a second voltage pad; and
   the N-type SCR is connected in parallel with the P-type SCR between the first voltage pad and the second voltage pads,
   wherein a P+ active region, connected to the first voltage pad, and a P-drift region configure the double diffused drain N-type MOSFET, and contact an HN-well and an HP-well simultaneously.

2. The electrostatic discharge protection device of claim 1, wherein the P-type SCR includes a horizontal PNP bipolar junction transistor (BJT) mutually coupled with a vertical NPN BJT.

3. The electrostatic discharge protection device of claim 1, wherein the N-type SCR includes a horizontal NPN BJT mutually coupled with a vertical PNP BJT.

4. The electrostatic discharge protection device of claim 1, wherein an N+ active region, connected to the second voltage pad, and an N-drift region configure the double diffused drain P-type MOSFET, and contact an HN-well and an HP-well simultaneously.

5. The electrostatic discharge protection device of claim 1, wherein an overlay margin of an N-drift region with respect to an N+ active region of the second voltage pad of the N-type SCR is smaller than an overlay margin of an N-drift region with respect to an N+ active region of the output pad of the P-type SCR.

* * * * *